Feb. 9, 1971 G. A. SHIFRIN 3,562,022

METHOD OF DOPING SEMICONDUCTOR BODIES
BY INDIRECT ION IMPLANTATION
Filed Dec. 26, 1967

Gordon A. Shifrin,
INVENTOR.
BY.
W H MacAllister Jr
ATTORNEY.

United States Patent Office 3,562,022
Patented Feb. 9, 1971

3,562,022

METHOD OF DOPING SEMICONDUCTOR BODIES BY INDIRECT ION IMPLANTATION

Gordon A. Shifrin, Malibu, Calif., assignor to Hughes Aircraft Company, Culver City, Calif., a corporation of Delaware Filed Dec. 26, 1967, Ser. No. 693,216
Int. Cl. H01l 7/54
U.S. Cl. 148—1.5 7 Claims

ABSTRACT OF THE DISCLOSURE

Method of doping a semiconductor body by applying a layer of the desired dopant on the surface of the semiconductor, irradiating this dopant layer with a beam of inert ions to drive atoms of the dopant into the semiconductor body.

This invention relates to semiconductor devices and to methods for fabricating the same. More particularly, the invention relates to methods for altering the electrical characteristics (i.e., the resistivity) of predetermined portions of a semiconductor body by incorporating conductivity-type-determining impurities in such portions.

As used herein the term "impurities" and "dopant" are employed to designate materials which are intentionally incorporated into the crystal lattice structure of a semiconductor body so as to establish a particular type of current conductivity therein. Such intentional incorporation of an impurity in a semiconductor body results in altering the electrical characteristics of the portion of the body in which the impurity is incorporated so as to either change the conductivity-type or resistivity of this portion. An impurity atom containing at least one more valence electron than an atom of the semiconductor material is termed an n-type (negative) impurity or donor since it contributes electrons for current conduction in the semiconductor crystal body. An impurity atom containing at least one less valence electron than an atom of the semiconductor material is termed a p-type (positive) impurity or an acceptor since it contributes "holes" (or has vacancies which accept electrons) for current conduction. The process of incorporating such conductivity-type-determining type impurities in a semiconductor body is called "doping."

One widely used method for introducing an impurity into a semiconductor body (or a pre-selected portion thereof) is the process of diffusion. By this process impurity atoms penetrate the semiconductor crystal lattice structure generally under the influence of elevated temperatures but without necessarily melting the semiconductor body. Atomic migration from an impurity material occurs when that material is brought into contact with a portion of the semiconductor body whether the impurity material is in the solid, liquid or gaseous phase thereof. It is preferred in the art of making semiconductor devices by the diffusion process to employ gaseous diffusion which means that the semiconductor body is disposed in an atmosphere containing atoms of the impurity to be introduced therein. The speed of the diffusion process, being temperature dependent, is generally accelerated and controlled by maintaining the semiconductor body at some elevated temperature below the melting point of the semiconductor body. High temperatures, such as 1000° C. in the case of silicon semiconductor material, for example, are utilized in order to achieve processing in the shortest time for reasons of production efficiency and economy.

The impurity atoms in a diffusion process are, as noted, usually in a vapor state and are not controllable except by thermo-dynamic techniques. In effect, the impurity atoms in this process "drift" into contact with an exposed surface of a semiconductor body and continue to drift into the semiconductor body in a more or less random fashion in accordance with thermo-dynamic principles. Among the disadvantages of the diffusion process are the nonuniform distribution of impurity atoms depth-wise in the semiconductor body which results in surface portions being doped more heavily than interior portions and the fact that the impurity atoms drift into and disperse laterally as well as vertically in the semiconductor body. Thus, one of the chief disadvantages of the diffusion process is that in order to obtain a given concentration and/or diffusion depth in a semiconductor body one must accept a sometimes undesirable and deleterious lateral diffusion dimension.

Another method of achieving the incorporation of conductivity-type-determining impurity in a semiconductor body is the process of ion implantation. In this process the impurity atoms which are otherwise of neutral charge or polarity are given a pre-determined electrical charge and are then said to be ionized. Such charged atoms are therefore referred to as ions. By means of an electric field these ions may be formed into beams of desirably different cross-sectional diameters and shapes and may also be made to travel in pre-determined controllable directions at predetermined controllable velocities much like the electrons in an electron beam. Hence, instead of drifting into the lattice structure of a semiconductor body in random directions as in diffusion, these ions can be made to enter the lattice structure at a predetermined direction and velocity and may be positioned where desired therein. Furthermore, the concentration of such impurities in a semiconductor body may be readily controllable and made uniform or graded throughout an implanted region as desired. In other words, ions of a desired conductivity-type-determining impurity may be made to enter a semiconductor body in a fixed and desired direction with little or no deviation therefrom and may be placed where desired to establish a region of given conductivity type of precise geometry and depth. Among the important advantages of the process is the fact that the semiconductor body need not be heated to excessive temperatures (e.g., above about 550° C.) which in other processes often deleteriously affects the semiconductor and renders precise control during fabrication tedious and expensive.

The process just described may be referred to as direct ion implantation, by which is meant that atoms of the desired conductivity-type-determining impurity are ionized and directly implanted into the semiconductor body. Such direct ion implantation has some disadvantages. Thus, the variety of conductivity-type-determining impurities available for doping the semiconductor body is limited; only those impurities that can be conveniently ionized are of practical value in this process. In addition, when one desires to dope the same semiconductor body with different types of conductivity-type-determining impurities, there is a need for providing different ion sources to generate the different ion beams desired.

It is therefore an object of the present invention to provide an improved method of incorporating conductivity-type-determining impurities in a semiconductor body.

Another object of the invention is to provide an improved method of ion implanting conductivity-type-determining impurities in a semiconductor body.

These and other objects and advantages of the invention are achieved by an indirect ion implantation process wherein a layer or discrete layers of a conductivity-type-determining impurity materials may be first applied or deposited on a preselected area or areas of a semiconductor body. Prescribed portions of the impurity layer or layers are then bombarded or irradiated with ions of another material which may be either a dopant material or an electrically inert material. An inert material in the instant specification and claims means a material which does not establish any particular type of conductivity in the semiconductor body and which does not otherwise adversely affect the electrical properties of a semiconductor body. When the impurity layer is bombarded by these ions (which may be referred to as primary particles), atoms (which may be referred to as secondary particles) of the material constituting this layer are driven into the lattice structure of the underlying semiconductor body thus establishing or contributing to the requisite type of conductivity. The impurity or dopant layer or portions of this layer may then be removed from the surface of the semiconductor body. In this manner conductivity-type-determining impurities may be incorporated into the semiconductor body notwithstanding the fact that these impurities are not readily ionized and capable of being directly incorporated in the body by ionization.

The invention will be described in greater detail by reference to the drawing in which.

Figure 1:
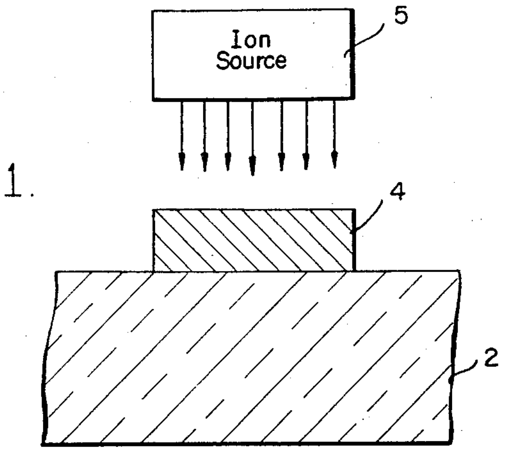
FIG. 1 is a partial cross-sectional elevational view of a semiconductor body having a dopant layer on the surface thereof during irradiation by a beam of inert ions.

Referring now to the drawings to aid in explaining the invention, the first step is to provide a semiconductor body 2 with a dopant layer 4 of a conductivity-type-determining impurity suitable for establishing the desired type of conductivity in the semiconductor body. The semiconductor may be any of the various semiconductors known including such elemental semiconductors as silicon and germanium as well as such compound semiconductors as gallium arsenide. The practice of the process of the invention may be of particular advantage in the fabrication of compound semiconductor devices because of the low vapor pressure of such constituents of these semiconductor materials as arsenic and phosphorus (as in indium phosphide, for example) which makes it impractical to heat such semiconductor bodies to the temperatures required in such other processes as alloying or diffusion, it being understood that such high temperature heating of the semiconductor is not required in the ion implantation process of the invention.

The dopant layer 4 may be applied to a selected portion or portions of the surface of the semiconductor body 2 by any convenient technique depending upon the physical and chemical properties of the dopant. Thus, the dopant may be applied by vapor-deposition in the case of aluminum, for example, or by solution plating processes in the case of gallium, for example, or by sputtering. Different types of conductivity-type-determining impurities may also be applied to different discrete portions of the semiconductor body if desired.

The next step is to place the thus-coated semiconductor body 2 in suitable apparatus for permitting the dopant layer to be irradiated by primary particles or ions of an inert or dopant material. Since a vacuum is necessary for the formation and utilization of an ion beam, the semiconductor body will be positioned in a chamber which is evacuated and in which is disposed a suitable source 5 of ions. For the purposes of the present invention a typically suitable ion source is shown and described in the copending application of R. G. Wilson, G. R. Brewer and D. M. Jamba, Ser. No. 640,441, filed May 16, 1967, now Pat. No. 3,479,545, entitled "Surface Ionization Apparatus" and assigned to the instant assignee. The dopant layer 4 is then subject to bombardment by these primary particles with the result that as these high energy particles pass through the dopant layer some of their momentum is transferred to individual atoms or secondary particles of the dopant material which in turn are driven into the crystal lattice structure of the underlying semiconductor body 2. This process is continued until the desired dopant carrier concentration is achieved and/or the desired value of resistivity is attained. Thus, the implantation process will be continued until the implanted region 6 has attained the desired physical and electrical properties. In this way a PN junction device may be formed, for example, in which the P-type region (e.g., the region 6 in FIG. 2) is formed in a semiconductor body of N-type conductivity. It is also within the scope of the present invention to dope a preselected region of a semiconductor body so as to merely alter the electrical resistivity of this region without changing its conductivity type. Thus, an ohmic contact may be provided to an N-type semiconductor body of predetermined conductivity by doping a portion of this body with impurity ions capable of establishing the same type of conductivity therein so that this doped region is of lower resistivity, generally denominated as "N+," for example. (In the case of a P-type body the contact would be "P+.")

Figure 2:
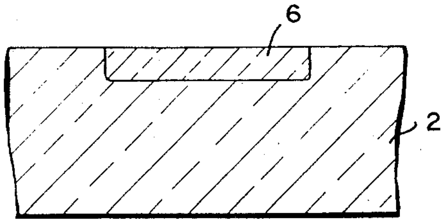
FIG. 2 is a similar view of a semiconductor body shown in FIG. 1 after implantation of the dopant material therein and with the dopant layer removed therefrom.
Figure 3:
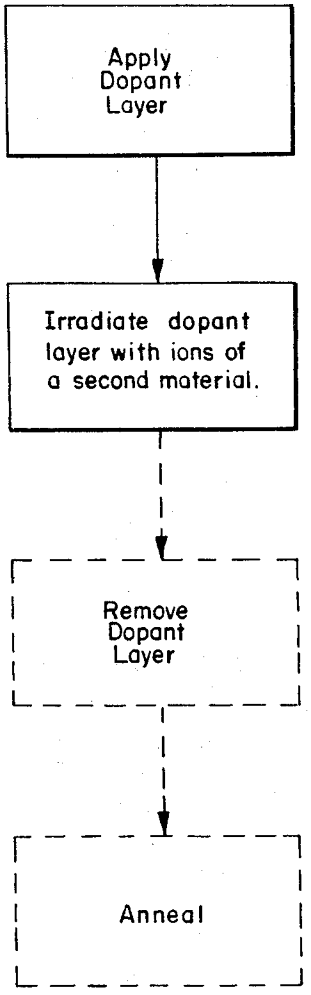
FIG. 3 is a process step flow chart of the method of the invention.

After the attainment of a doped region of the desired physical, geometric, and electrical properties, the dopant layer 4 may be removed from the surface of the semiconductor body if desired, leaving a semiconductor structure such as shown in FIG. 2, the region 6 being the ion-implanted or ion-doped portion of the semiconductor body. This removal of the dopant layer 4 may be accomplished mechanically or preferably chemically, as by chemical etching. It may also be necessary or at least preferable to subject the semiconductor body to a heat or annealing treatment after removal of the dopant layer in order to relieve any damage to the semiconductor crystal lattice structure caused by the penetration of high energy ions thereinto. In addition it is believed that at least in some instances such an annealing also serves to activate, electrically speaking, the implanted dopant atoms. The annealing operation is believed to permit the lattice structure to relax sufficiently so that atoms of the parent semiconductor structure, which have been misplaced by collision with an incoming ion, can move back to their proper crystal structure position. Also, such crystal lattice relaxation may permit dopant atoms which have initially come to rest interstitially in the lattice structure to move to substitutional positions in the lattice sructure. Such annealing may be saisfactorily achieved by heating the semiconductor body to a temperature of 500° C. to 600° C. for 10 to 20 minutes, for example. In general, the requisite annealing temperatures are much lower than those required for diffusion so that the semiconductor body is still not subjected to detrimentally high temperatures.

Suitable materials for use as an inert bombarding ion beam are any materials whose atoms are electrically inert in the semiconductor body. By "electrically inert" it is meant that the atoms of such materials do not contribute to electrical conduction in the semiconductor as either an acceptor or donor material. Typically satisfactory ion source materials for the purposes of the present invention are carbon or silicon itself (when the host or substrate crystal is silicon) as well as such noble gases as helium, neon and krypton. In some instances it may be desirable to utilize primary particles which are electrically active in order to achieve some special concentrations and charge carrier distributions with depth in the host, and it is within the scope of the present invention to utilize such active particles for the bombarding particle beam.

The dopant materials that may be used as the dopant layer are those conventionally known and used for doping semiconductors. Thus, for establishing P-type conductivity such acceptors as aluminum, boron, indium and gallium may be utilized while for N-type conductivity such donors as arsenic, phosphorus, antimony and bismuth are suitable.

It will be appreciated that there is a direct relationship between the thickness of the dopant dayer and the energy of the inert ion beam: the greater the thickness of the dopant layer, the higher the required beam energy. Further considerations however modify this relationship so that it is not strictly a linear one. Thus, the desired depth of implantation of dopant atoms also depends upon the energy of the bombarding ion beam so that a greater energy than necessary merely to achieve penetration of the beam through the dopant layer may be utilized in order to drive the dopant atoms to some desired depth in the semiconductor body, it being understood that the action of driving the dopant atoms into the semiconductor involves a transfer of momentum from the ions of the beam to the dopant atoms.

As a typical example of the practice of the invention, PN junctions were made in N-type silicon bodies by first forming dopant layers of aluminum on predetermined portions thereof. In one case a layer of aluminum 175 A. thick was utilized while in another example the aluminum layer was 375 A. thick. Both samples were irradiated with 60 kv. beams of carbon ions. After removal of the aluminum dopant layers from the two samples, they were annealed in vacuum at a temperautre of 500° C. for ten minutes. Subsequent electrical tests confirmed the establishment of aluminum-doped P-type regions in the N-type silicon bodies and that the junctions thus-formed exhibited rectification and light-sensitive properties comparable to those formed by prior art diffusion techniques.

There thus has been described a novel and uniquely advantageous method for introducing conductivity-type-determining impurities into a semiconductor body. The precise positioning and concentration of dopant atoms is achieved by the implantation method of the invention while making it possible to choose dopant materials from a wider variety of species than may be convenient in a direct ion implantation process. In addition, because of the wide angle scattering of the dopant atoms likely to result from the transfer of momentum mechanics of the process, the depth of the implanted region and particularly of the P-N junction formed may be quite shallow which feature is of great practical importance in photosensitive devices such as photocells. Such scattering can help avoid channeling effects and produce a region of high dopant concentration close to the surface of the semiconductor body which is an important feature for solar cell devices. Also highly intricate patterns of doping may be achieved by the process of the invention in conjunction with photoetching or other engraving techniques to form the desired dopant layer pattern.

What is claimed is:

1. The method of introducing a conductivity-type-determining impurity into a semiconductor body comprising the steps of: applying a layer of a conductivity-type-determining impurity on a preselected portion of a surface of a semiconductor body, and irradiating said layer with ions of an electrically inert material whereby atoms of said impurity are driven into said semiconductor body.

2. The method according to claim 1 including the steps of: removing at least a portion of said impurity layer from said surface of said semiconductor body after the step of irradiating said impurity layer with said ions.

3. The method according to claim 1 including the steps of: removing said impurity layer from said surface of said semiconductor body after the step of irradiating said impurity layer with said ions; and thereafter annealing said semiconductor body.

4. The method according to claim 1 wherein said electrically inert material is selected from the group consisting of carbon, silicon, and a noble gas.

5. The method of forming a PN junction in a semiconductor body comprising the steps of: forming a layer of dopant material, capable of establishing a given type of conductivity in a semiconductor body, on a preselected portion of a surface of a semiconductor body having a conductivity type opposite to that of said given type; and irradiating said layer with ions of an electrically inert material whereby atoms of said dopant material are driven into said semiconductor body.

6. The method according to claim 5 including the steps of: removing said layer of dopant material from said surface of said semiconductor body after the step of irradiating said layer with said ions; and thereafter annealing said semiconductor body.

7. The method of introducing a conductivity-type-determining impurity into a semiconductor body comprising the steps of: applying a layer of a conductivity-type-determining impurity, capable of establishing a given type of conductivity in a semiconductor body, on a preselected portion of a surface of a semiconductor body having the same type of conductivity as said given type; and irradiating said layer with ions of an electrically inert material whereby atoms of said impurity are driven into said semiconductor body.

References Cited

UNITED STATES PATENTS

| | | | |
|---|---|---|---|
| 3,290,189 | 12/1966 | Migitaka | 148—188 |
| 3,317,354 | /1967 | Darrow et al. | 204—164 |
| 3,457,632 | 7/1969 | Dolan, Jr. et al. | 29—578 |

L. DEWAYNE RUTLEDGE, Primary Examiner

R. A. LESTER, Assistant Examiner

U.S. Cl. X.R.

29—578, 580; 117—93.3; 148—186, 188